(12) United States Patent
Takashima et al.

(10) Patent No.: US 8,624,272 B2
(45) Date of Patent: Jan. 7, 2014

(54) LED ASSEMBLY WITH COLOR TEMPERATURE CORRECTION CAPABILITY

(75) Inventors: Jun Takashima, Osaka (JP); Kanai Norio, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/210,147

(22) Filed: Aug. 15, 2011

(65) Prior Publication Data

US 2011/0297974 A1 Dec. 8, 2011

Related U.S. Application Data

(63) Continuation of application No. 12/429,787, filed on Apr. 24, 2009.

(30) Foreign Application Priority Data

Apr. 24, 2008 (JP) .................................. 2008-113315

(51) Int. Cl.
*H01L 33/60* (2010.01)
(52) U.S. Cl.
USPC .............. 257/88; 257/E33.072; 257/E33.073; 257/E33.059
(58) Field of Classification Search
USPC ..................... 257/88; 313/503, 498, 512, 509; 428/690; 349/69; 362/84
See application file for complete search history.

(56) References Cited

U.S. PATENT DOCUMENTS

| | | | | |
|---|---|---|---|---|
| 2002/0149546 A1* | 10/2002 | Ben-Chorin et al. | ........... | 345/32 |
| 2006/0091779 A1* | 5/2006 | Takeda et al. | .................. | 313/487 |
| 2008/0036362 A1* | 2/2008 | Tanimoto et al. | ............. | 313/498 |
| 2009/0140630 A1* | 6/2009 | Kijima et al. | ................. | 313/498 |
| 2009/0140633 A1* | 6/2009 | Tanimoto et al. | ............. | 313/503 |

FOREIGN PATENT DOCUMENTS

| | | | | |
|---|---|---|---|---|
| JP | 2005302483 | * | 10/2005 | ............. F21V 19/00 |
| JP | 2006-236749 | | 7/2006 | |
| JP | 2006-237571 | | 7/2006 | |

OTHER PUBLICATIONS

Japanese examination report issued on Jun. 26, 2012.

* cited by examiner

*Primary Examiner* — Jarrett Stark
*Assistant Examiner* — Lawrence Tynes, Jr.
(74) *Attorney, Agent, or Firm* — Waddey Patterson; Mark J. Patterson; Gary L. Montle

(57) ABSTRACT

An illumination assembly is provided which is capable of correcting a color temperature. The assembly includes a substrate with a plurality of coatings applied on a respective plurality of surface portions of a base material. A light emitting device includes one or more light emitting elements of a first color temperature mounted on surface portions of the substrate having a first color coating, and one or more light emitting elements having a second color temperature mounted on surface portions of the substrate having a second color coating. Light emitting elements are individually sealed with a resin containing an excitable phosphor, with a reflectance factor of the first color coating and a reflectance factor of the second color coating set corresponding to light emitted from the light emitting elements having the first and second color temperatures, respectively, with respect to a desired color temperature for the light emitting device.

8 Claims, 5 Drawing Sheets

LED ASSEMBLY WITH COLOR TEMPERATURE CORRECTION CAPABILITY

CROSS-REFERENCES TO RELATED APPLICATIONS

This application claims benefit of the following patent application which is hereby incorporated by reference: Japanese Patent Application No. JP2008-113315 filed Apr. 24, 2008; and is a continuation of U.S. patent application Ser. No. 12/429,787, filed Apr. 24, 2009.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

The present invention relates to an illumination device using a light emitting element such as a light emitting diode (hereinafter referred to as "LED").

In a conventional illumination device using a light emitting element such as an LED, countermeasures are taken to make it waterproof in consideration of the outdoor installation. At least one waterproofing technique has previously been employed in which a case is filled with a transparent resin.

For example, Japanese Unexamined Patent Publication No. 2005-302483 discloses an illumination device providing: a substrate with an LED mounted thereon; and a transparent and nearly box-shaped case with a back surface formed as an opening, wherein: the substrate is stored in the case from the opening; the substrate is supported with a space provided between the substrate and a front inner wall of the case; a transparent filling material is injected and filled in the case along a following path from the opening to the case; the filling material is cured to fix the substrate and the case integrally; and thus the LED along with the substrate are embedded in the filling material in the case and hermetically sealed, thereby ensuring a sufficient waterproof property. When the LED is lighted, the light is emitted through the transparent filling material and the case.

A white or blue-colored LED used for the purpose of the illumination typically has a structure in which an LED chip that emits blue light (light with wavelength of approximately 380 to 480 nm) is sealed with a resin containing a phosphor (e.g., silicon, epoxy). The conversion to a desired color of light is performed by means of the light with a wavelength region of approximately 480 to 780 nm that is converted by exciting the phosphor by the blue light emitted from the LED chip, and blue light that passes through the resin without being converted. Also, in the conversion to a desired color of light, the color of light is adjusted by, for example, changing a mixing ratio of the phosphor in the case where a top surface of the sealing resin containing the phosphor is an air layer. It is not premised on filling the top surface of the sealing resin containing the phosphor with the transparent resin (e.g., silicon).

When the case that stores the LED is filled with translucent silicon for the purpose of waterproofing, a refractive index of the sealing resin for the LED is almost equal to that of the silicon to be filled for the purpose of waterproofing. Therefore, there is a problem that the color temperature significantly shifts to a side of high color temperature due to a difference of the ratio between the light converted by exciting the phosphor by the blue light emitted from the LED chip, and the blue light that passes through without being converted, as compared to the case where the top surface of the sealing resin containing the phosphor is the air layer. An increase of the ratio of the blue light makes a white LED appear to be bluish white, and a bulb-colored LED appear to be yellowish white.

BRIEF SUMMARY OF THE INVENTION

In view of the foregoing, an object of the present invention is to provide an illumination device capable of correcting the color temperature.

In light of this object, in a particular embodiment of the present invention an LED assembly is provided which includes a substrate with a plurality of coatings applied on a respective plurality of surface portions of a base material. A light emitting device includes one or more light emitting elements of a first color temperature mounted on surface portions of the substrate having a first color coating, and one or more light emitting elements having a second color temperature mounted on surface portions of the substrate having a second color coating. Light emitting elements are individually sealed with a resin containing an excitable phosphor, with a reflectance factor of the first color coating and a reflectance factor of the second color coating set corresponding to light emitted from the light emitting elements having the first and second color temperatures, respectively, with respect to a desired color temperature for the light emitting device.

The assembly may in some aspects further include a translucent resin applied on the light emitting device and the substrate, the translucent resin having a refractive index and correspondingly effective to suppress variations in color temperature.

In another aspect, the assembly may include a transparent case encompassing the light emitting device, the substrate and the translucent resin applied on the light emitting device and the substrate.

In yet another aspect, the inside of the case may be completely filled with the translucent resin applied on the light emitting device and the substrate.

DETAILED DESCRIPTION OF THE INVENTION

Figure 1:
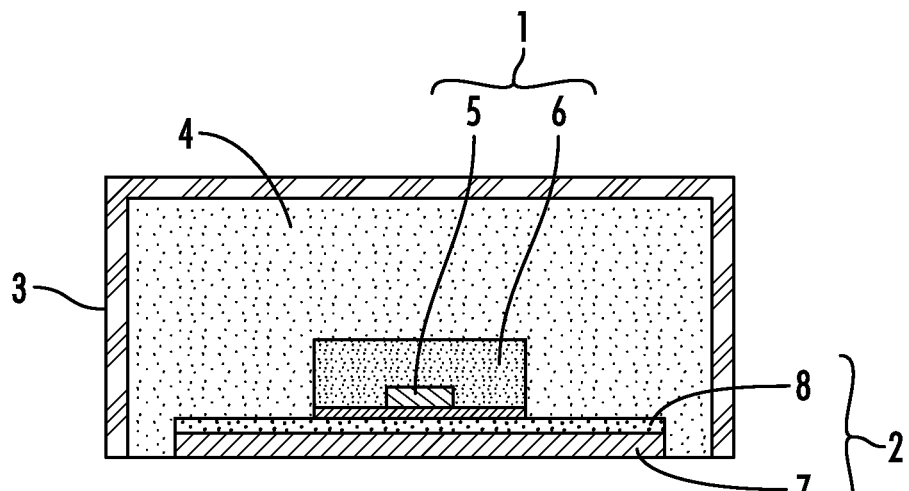
FIG. 1 is a cross-sectional view showing a structure according to a first embodiment of the present invention.

FIG. 1 shows a structure of a first embodiment of the present invention. As shown in FIG. 1, an illumination device includes a light emitting device 1 such as for example an LED 1, an LED mounting substrate 2 on which the LED is mounted, a case 3 for storing them, and a translucent filling material 4 such as resin 4 (e.g., silicon) for filling the inside of the case 3. The translucent filling material 4 may in fact be entirely transparent in alternative embodiments.

The LED 1 comprising the light emitting device may be provided with a blue LED chip 5 which emits light with a wavelength of approximately 380 to 480 nm, the blue LED chip sealed with a resin 6 (e.g., silicon) containing a phosphor. One sealing resin 6 may encompass a plurality of LED chips 5.

The substrate 2 on which the LED 1 is mounted comprises a base material 7, and a coating (ink) 8 applied on the base material 7. The LED 1 and the substrate 2 are embedded and hermetically sealed in the resin 4. The case 3 is transparent, so that, upon lighting the LED 1, the light therefrom is emitted through the translucent resin 4 and the case 3.

Conventionally, a white coating (ink) has been generally used as the coating (ink) 8 to apply on the base material 7, in consideration of a reflection efficiency for reflecting light reflected by the case 3 and an air layer at the surface of the substrate 2 to emit the light to the outside of the case 3; whereas a yellow coating (ink) is applied in the present embodiment.

Thus, the substrate surface reflects only light within a high luminosity region (yellow light) and absorbs the blue light among the light reflected by the case 3 and the air layer. This can reduce the shift of the color temperature to a higher color temperature, without decreasing an optical output.

In alternative embodiments, the same effect as those described above can be achieved by applying on the substrate surface a substance such as a film 8 which reflects the light within a high luminosity region and absorbs the blue light, instead of coating the base material 7 with the ink 8. Such effect also can be achieved by employing a translucent material other than a resin as the resin 4 for filling the case 3.

Figure 2:
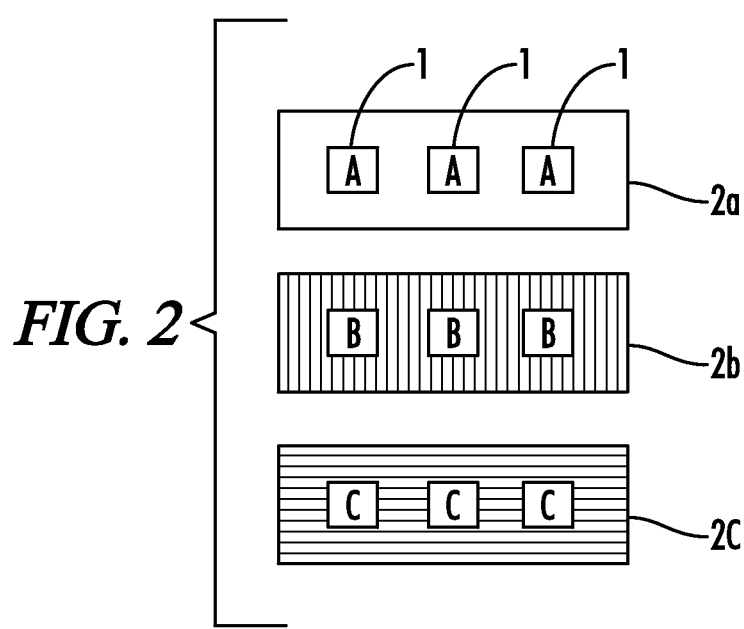
FIG. 2 is a cross-sectional view showing a structure according to a second embodiment of the present invention.

In another embodiment as shown in FIG. 2, references 2a, 2b and 2c are LED mounting substrates of the illumination devices different from one another. When the LEDs 1 of a plurality of illumination devices have different color temperatures respectively (i.e., A, B and C depicted in the figure have the different color temperatures), as shown in FIG. 2, the adjustment of a coloration of the coatings (ink) to be applied on the substrate surfaces of the mounting substrates 2a, 2b and 2c of the LEDs 1 can suppress the variation among the color temperatures of the illumination devices. Specifically, a substrate surface having the LED with a low color temperature is colored not to absorb the blue light (for example, white), and a substrate surface having the LED with a high color temperature is colored to absorb the blue light (for example, yellow). Thereby, the variation of the color temperatures can be suppressed among a plurality of illumination devices.

Figure 3:
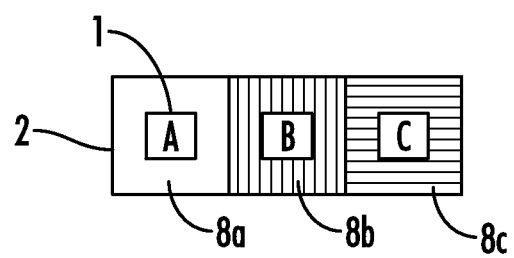
FIG. 3 is a cross-sectional view showing a structure according to a third embodiment of the present invention.

In another embodiment as shown in FIG. 3, references 8a, 8b and 8c are coatings (ink) having different colors respectively, which are applied on the surface of the LED mounting substrate 2 of the illumination device. When the LEDs 1 of a single illumination device have different color temperatures respectively (i.e., A, B and C depicted in the figure have different color temperatures), as shown in FIG. 3, the adjustment of a coloration of the coatings (ink) 8a, 8b and 8c to be applied on the substrate surface of the mounting substrate 2 of the LEDs 1 can suppress the variation of the color temperatures inside of the illumination device. Specifically, the portion of the substrate upon which the LED with a low color temperature is mounted and the periphery thereof are colored not to absorb blue light (for example, white), and the portion of the substrate upon which the LED with a high color temperature is mounted and the periphery thereof are colored to absorb the blue light (for example, yellow). Thereby, the variation of the color temperatures can be suppressed inside of the illumination device.

Figure 4:
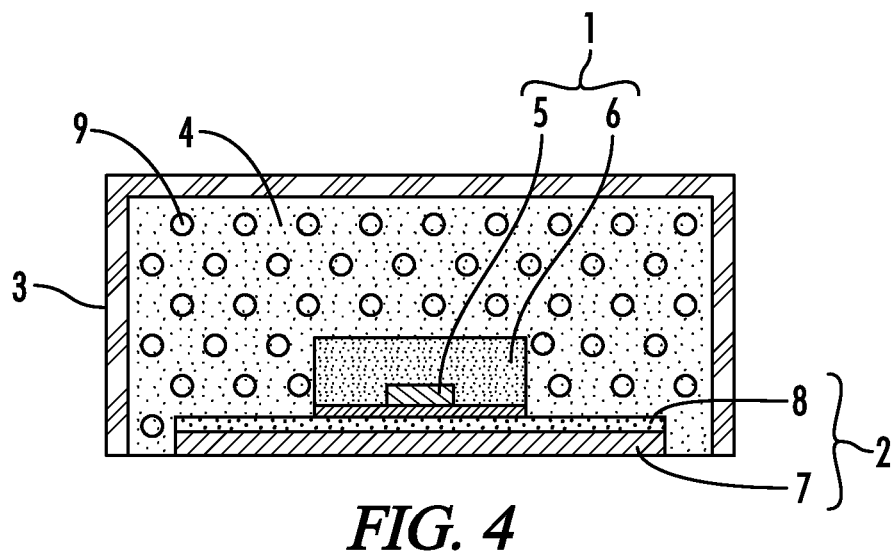
FIG. 4 is a cross-sectional view showing a structure according to a fourth embodiment of the present invention.

In an embodiment as shown in FIG. 4, the translucent filling material 4 of the LED assembly comprises a material 9 (e.g., a pigment) that absorbs blue light and that is added in the resin 4. This allows the blue light to be absorbed by the material 9 contained in the resin 4, thereby enabling the reduction of the shift of the color temperature to a higher color temperature. Furthermore, adjustment of a compounding ratio of the material 9 that absorbs the blue light enables the color temperature to be adjusted.

Figure 5:
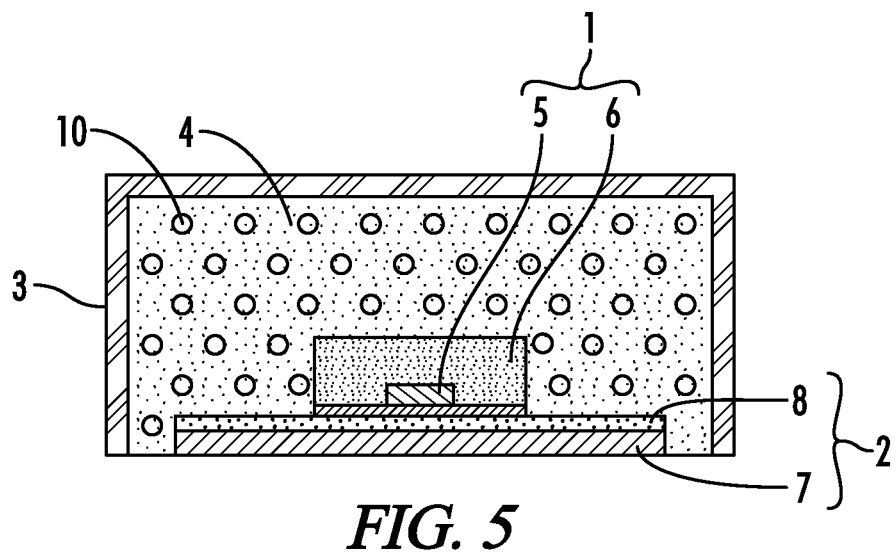
FIG. 5 is a cross-sectional view showing a structure according to a fifth embodiment of the present invention.

In an embodiment as shown in FIG. 5, the translucent filling material 4 of the LED assembly further comprises a phosphor 10 that converts blue light (light with wavelength of approximately 380 to 480 nm) to light with a wavelength region of approximately 480 to 780 nm. This structure allows the blue light to be converted to the light with the wavelength region of approximately 480 to 780 nm by exciting the phosphor 10 contained in the resin 4. This can reduce the shift of the color temperature to a higher color temperature. In addition, converting the blue light to the light with the wavelength of approximately 480 to 780 nm can increase an optical output in comparison to some alternative embodiments.

The translucent filling material 4 may in certain embodiments comprise both of the phosphor 10 and the pigment 9 in conjunction with each other. An adjustment of the mixing ratio between the phosphor 10 and the pigment 9 within the translucent filling material 4 or resin 4 further enables the color temperature to be adjusted.

Figure 6:
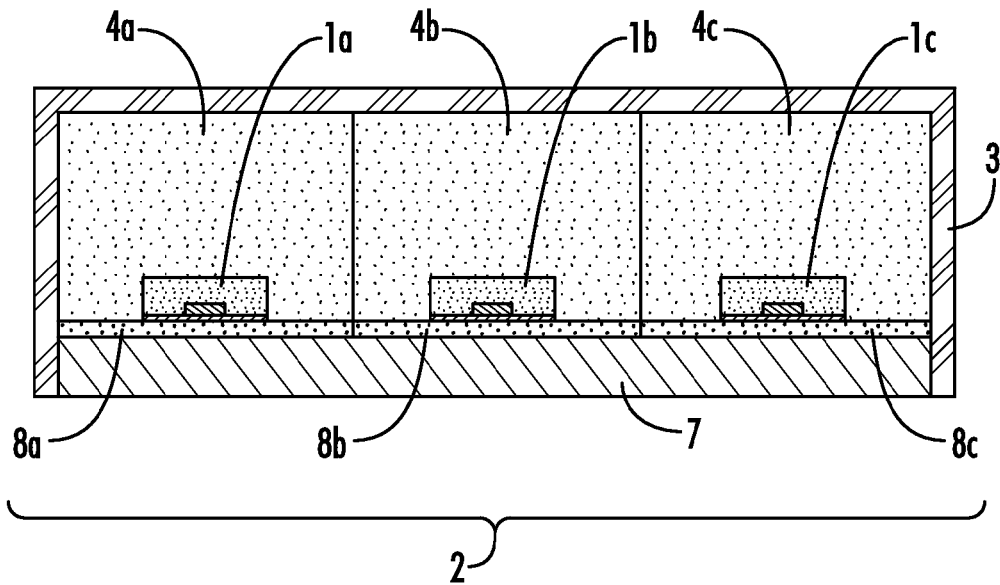
FIG. 6 is a cross-sectional view showing a structure according to a sixth embodiment of the present invention.

In an embodiment of the LED assembly as shown in FIG. 6, the substrate 2 on which a plurality of LEDs 1a, 1b and 1c are mounted includes a base material 7 and yellow coatings (ink) 8a, 8b and 8c applied on the base material 7, and is disposed at an opening of the transparent case 3. The LEDs 1a, 1b and 1c as the light emitting devices are provided with blue LED chips that emit the light with wavelength of approximately 380 to 480 nm, and the blue LED chips are sealed with a resin (for example, silicon) containing a phosphor. In this case, the LEDs 1a, 1b and 1c emit the light varied from one another, and the relationship thereof shall be (a color temperature of the light emitted from the LED 1a)>(a color temperature of the light emitted from the LED 1b)>(a color temperature of the light emitted from the LED 1c).

The inner space of the case 3 is filled with the translucent filling resins (for example, silicon) 4a, 4b and 4c within the respective portions where a plurality of LEDs 1a, 1b and 1c are mounted. The presetting is now made so as to be (a refractive index of the resin 4a)>(a refractive index of the resin 4b)>(a refractive index of the resin 4c).

When the filling is performed onto the LEDs 1a, 1b and 1c with the translucent filling resins 4a, 4b and 4c, the emission colors thereof shift to blue. The shift to blue, however, can be reduced by means of the yellow coatings (ink) 8a, 8b and 8c.

The presetting is now made so as to be (a color temperature of the yellow coating 8a)<(a color temperature of the yellow coating 8b)<(a color temperature of the yellow coating 8c). The higher the color temperatures of the yellow coatings (ink) 8a, 8b and 8c become, the more the substrate 2 absorbs the blue light, thereby reducing the shift to blue. Also, the lower the refractive indices of the translucent filling resins 4a, 4b and 4c become (the nearer the refractive index of the air become), the more the shift to blue is reduced.

Therefore, as shown in the present embodiment, even if the LEDs 1a, 1b and 1c emit light having varying color temperatures from one another, the variation of the color temperatures in the illumination device can be suppressed by adjusting the color temperatures of the yellow coatings (ink) 8a, 8b and 8c applied on the base material 7, as well as the refractive indices of the translucent filling resins 4a, 4b and 4c.

As described above, adjustment of the coloration of the coatings applied on the LED mounting substrate and the refractive indices of the filling resins can suppress the variation of the color temperatures in the illumination device with greater reliability and less cost than alternative methods.

Figure 7:
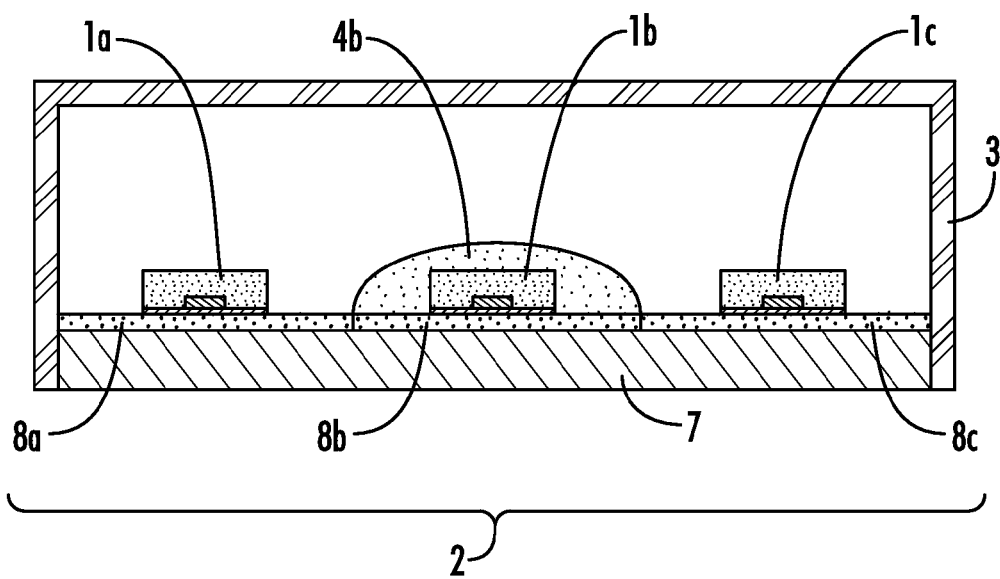
FIG. 7 is a cross-sectional view showing a structure according to a seventh embodiment of the present invention.

FIG. 7 shows a structure of another embodiment of the LED assembly. The substrate 2 on which a plurality of LEDs 1a, 1b and 1c are mounted includes the base material 7 and the coatings (ink) 8a, 8b and 8c applied on the base material 7, and is disposed at an opening of the transparent case 3. The LEDs 1a, 1b and 1c as the light emitting devices are provided with blue LED chips that emit the light with wavelength of approximately 380 to 480 nm, and the blue LED chips are sealed with a resin (for example, silicon) containing a phosphor. In this case, the LEDs 1a, 1b and 1c emit the light varied from one another, and the relationship thereof shall be (a color temperature of the light emitted from the LED 1a)=(a color temperature of the light emitted from the LED 1c)>>(a color temperature of the light emitted from the LED 1b); the LED 1a and LED 1c at both ends of the substrate have desired color temperatures, and the LED 1b in the middle of the substrate has an extremely low color temperature.

In this case, the coatings (ink) 8a and 8c on the periphery of the LEDs 1a and 1c at both ends of the substrate are the ones having lower reflectance factors to the blue light, such as yellow. In contrast, the coating (ink) 8b on the periphery of the LED 1b in the middle of the substrate is the one having a higher reflectance factor to the blue light, such as white or blue. This structure also includes a coating material 4b (such as silicon) being applied on the substrate surface (the coating 8b) on the periphery of the LED 1b in the middle of the substrate.

Here, when the filling is performed onto the LED 1b with a translucent filling material 4b or translucent coating material 4b such as a translucent resin 4b, the emission color thereof shifts to blue. Furthermore, since the coating (ink) 8b with a higher reflectance factor to the blue light increases the reflection of the blue light, the light coming from the coating material 4b can be shifted to blue. This enables the color temperature thereof to shift to the higher temperature, thereby making it possible to be brought closer to the color temperatures of the LEDs 1a and 1c on both ends of the substrate.

Changing the coloration of the coatings on the mounting substrate for the LEDs and coating a part of LEDs with the filling resin can suppress the variation of the color temperatures in the illumination device, even if employing the LEDs with the color temperatures different from one another in the illumination device that requires no filling resin.

Still referring to FIG. 7, the present embodiment permits selection of a color temperature of the LED 1 that is lower than that required for use in the illumination device as shown in the embodiment of FIG. 1. In other words, in consideration of the shift of the color temperature after the filling with the resin 4 in order to be waterproof, the color temperature is previously shifted. Specifically, the adjustment is performed for the compounding ratio of the phosphor that is a constituent of the LED 1, and the color temperature is set to be lower.

Figure 8A:
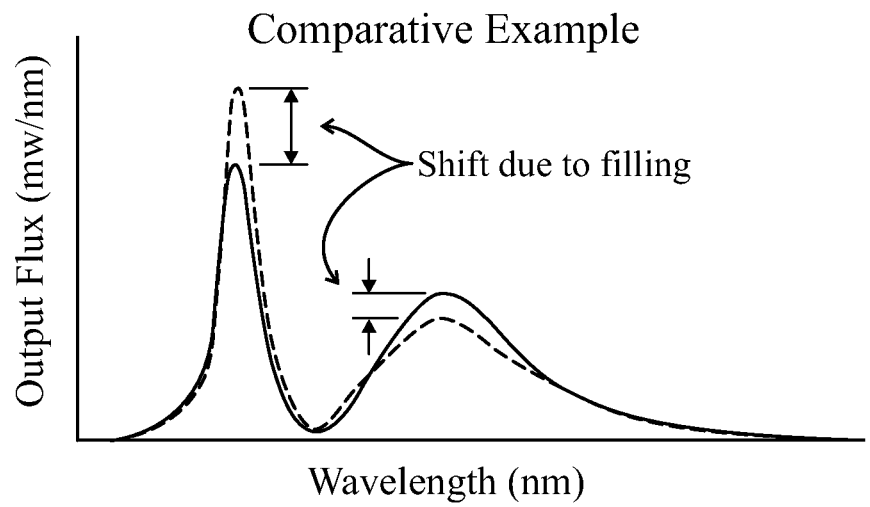
FIG. 8 is an explanatory diagram of an operation according to an eighth embodiment of the present invention.
Figure 8B:
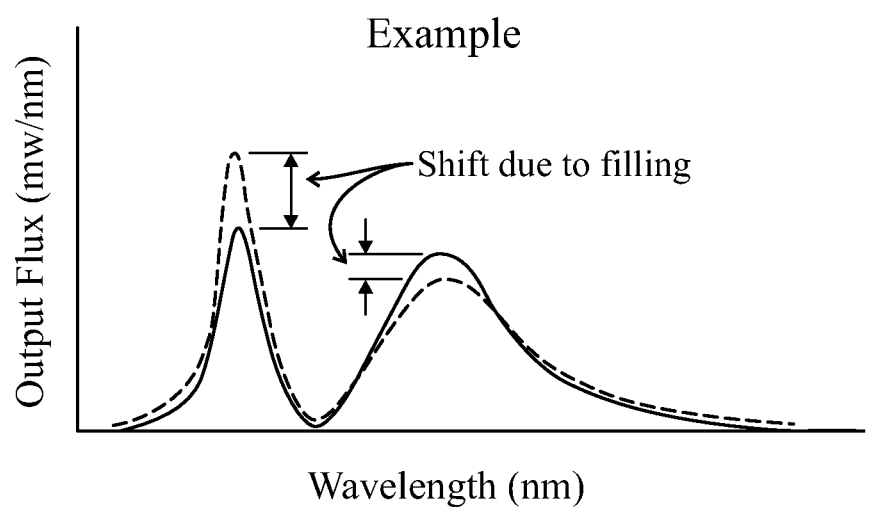

FIG. 8 shows an operation of another embodiment of the LED assembly. In the figure, (a) is a spectrum required as the illumination device, (b) is a spectrum of the light emitting device (the LED 1), and (c) is a spectrum after the light emitting device (the LED 1) is filled with the resin 4 to be waterproof.

FIG. 8(*a*) is an explanatory diagram of the operation of a comparative example, in which the spectrum required as the illumination device and the spectrum of the light emitting device (the LED 1) correspond to each other. Thus, the filling of the light emitting device (the LED 1) with the resin 4 to be waterproof makes the color temperature shift due to the filling, thereby rendering the color temperature different from the one required as the illumination device.

FIG. 8(*b*) is an explanatory diagram of the operation of the present embodiment, in which spectrum required as the illumination device and spectrum after the light emitting device (the LED 1) is filled with the resin 4 to be waterproof correspond to each other. Although the spectrum required as the illumination device differs from the spectrum of the light emitting device (the LED 1), the filling the light emitting device (the LED 1) with the resin 4 to be waterproof makes the color temperature shift due to the filling, thereby achieving the color temperature required as the illumination device.

Figure 9:
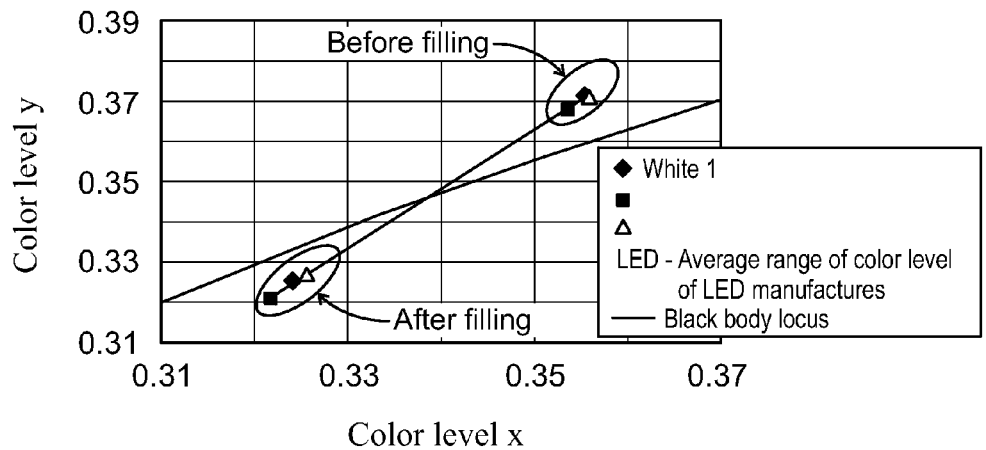
FIG. 9 is an explanatory diagram of an operation of a white LED according to the eighth embodiment of the present invention.
Figure 10:
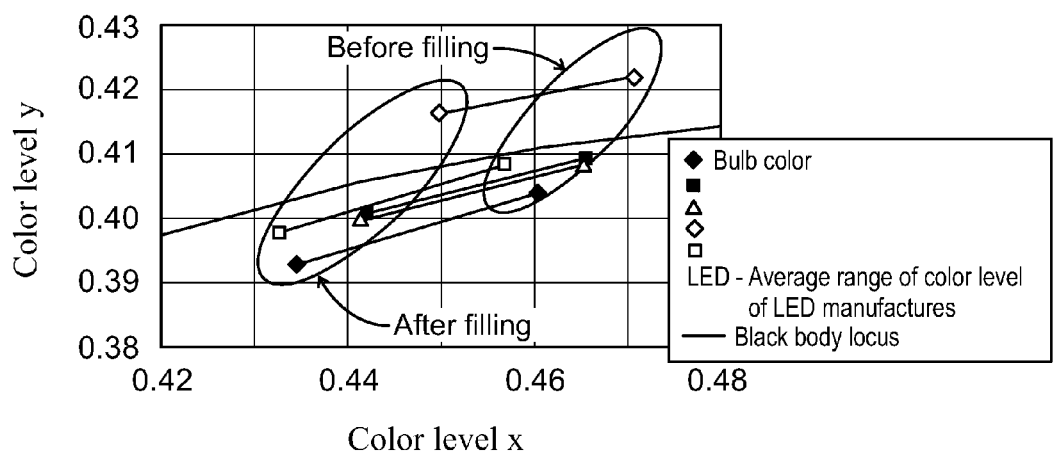
FIG. 10 is an explanatory diagram of an operation of a bulb-colored LED according to the eighth embodiment of the present invention.

Table 1 shows the result of the measurement of the optical characteristics before and after the filling, and Table 2 shows the amount of change before and after the filling of the silicon. FIG. 9 shows a change of the color temperature before and after the filling in the case of white LEDs shown in Tables 1 and 2, and FIG. 10 shows a change of the color temperature before and after the filling in the case of a bulb color.

TABLE 1

| Samples | Entire output flux (lm) | | Color level x | | Color level y | | Color temperature (K) | |
|---|---|---|---|---|---|---|---|---|
| | Before filling | After filling | Before filling | After filling | Before filling | After filling | Before filling | After filling |
| <White> | | | | | | | | |
| White 1 | 170.3 | 153.1 | 0.3553 | 0.3239 | 0.3711 | 0.3253 | 4714 | 5921 |
| White 2 | 170.9 | 153.5 | 0.3534 | 0.3217 | 0.3675 | 0.3207 | 4759 | 6055 |
| White 3 | 174.9 | 160.2 | 0.3555 | 0.3254 | 0.3707 | 0.3269 | 4707 | 5838 |
| <Bulb color> | | | | | | | | |
| Bulb color 1 | 106.9 | 112.9 | 0.4602 | 0.4346 | 0.4039 | 0.3930 | 2641 | 2946 |
| Bulb color 2 | 106.4 | 111.3 | 0.4656 | 0.4420 | 0.4092 | 0.4009 | 2609 | 2888 |
| Bulb color 3 | 106.4 | 111.1 | 0.4653 | 0.4413 | 0.4085 | 0.4000 | 2608 | 2893 |
| Bulb color 4 | 51.2 | 53.8 | 0.4706 | 0.4497 | 0.4218 | 0.4162 | 2639 | 2890 |
| Bulb color 5 | 52.5 | 55.1 | 0.4568 | 0.4328 | 0.4083 | 0.3979 | 2724 | 3019 |

TABLE 2

| Samples | Rate of change of entire output flux (%) | Color level x Amount of change | Color level y Amount of change | Amount of change of color temperature |
|---|---|---|---|---|
| <White> | | | | |
| White 1 | −10.1 | −0.0314 | −0.0458 | 1207 |
| White 2 | −10.2 | −0.0317 | −0.0468 | 1296 |
| White 3 | −8.4 | −0.0301 | −0.0438 | 1131 |
| Average | −9.6 | −0.0311 | −0.0455 | 1211 |
| <Bulb color> | | | | |
| Bulb color 1 | 5.6 | −0.0256 | −0.0109 | 305 |
| Bulb color 2 | 4.6 | −0.0236 | −0.0083 | 279 |
| Bulb color 3 | 4.4 | −0.0240 | −0.0085 | 285 |
| Bulb color 4 | 5.2 | −0.0209 | −0.0056 | 251 |
| Bulb color 5 | 5.0 | −0.0240 | −0.0104 | 295 |
| Average | 5.0 | −0.0236 | −0.0087 | 283 |

In the case of the white LED, when the color temperature of 5000K is required for the illumination device and the color temperature of an output flux of the LED 1 is 5000K, employing a waterproof structure as shown in FIG. 1 results in the shift of the color temperature to 6200K. Then, the color temperature of the LED 1 is previously selected at the lower color temperature of the order of, for example, 4000K. The filling of the resin to be waterproof makes the color temperature shift to a higher temperature. Nonetheless it is possible to provide the illumination device with the color temperature of 5000K (FIG. 9).

In the case of the bulb-colored LED, when the color temperature of 2800K is required for the illumination device and the color temperature of an output flux of the LED 1 is 2800K, employing the waterproof structure as shown in FIG. 1 results in the shift of the color temperature to 3100K. Then, the color temperature of the LED 1 is previously selected at a lower color temperature of the order of, for example, 2500K. The filling of the resin to be waterproof makes the color temperature shift to higher temperature. Nonetheless it is possible to provide the illumination device with the color temperature of 2800K (FIG. 10).

By use of embodiments described above, the color temperature can be corrected as desired and necessary for the illumination device.

Thus, although there have been described particular embodiments of the present invention of a new and useful LED Assembly with Color Correcting Substrate it is not intended that such references be construed as limitations upon the scope of this invention except as set forth in the following claims.

What is claimed is:

1. An illumination assembly, comprising:
   a substrate comprising a base material and a plurality of coatings applied on a respective plurality of surface portions of the base material,
      one or more of the coatings comprising a first color having a first reflectance factor, and
      one or more of the coatings comprising a second color having a second reflectance factor;
   a light emitting device mounted on the substrate, the light emitting device further comprising
      one or more light emitting elements having a first color temperature and mounted on surface portions of the substrate having the first color coating, wherein light emitted from the light emitting elements having said first color temperature and as reflected from the first color coating corresponds with a desired color temperature for the light emitting device,
      one or more light emitting elements having a second color temperature and mounted on surface portions of the substrate having the second color coating, wherein light emitted from the light emitting elements having said second color temperature and as reflected from the second color coating also corresponds with the desired color temperature for the light emitting device, and
      one or more of said light emitting elements further individually sealed with a resin containing a phosphor excitable by light emitted from the associated light emitting element.

2. The illumination assembly of claim 1, further comprising a translucent resin applied on the light emitting device and the substrate, the translucent resin having a refractive index and correspondingly effective to suppress variations in color temperature.

3. The illumination assembly of claim 2, further comprising a transparent case encompassing the light emitting device, the substrate and the translucent resin applied on the light emitting device and the substrate.

4. The illumination assembly of claim 3, wherein the inside of the case is completely filled with the translucent resin applied on the light emitting device and the substrate.

5. An illumination assembly, comprising:
- a substrate comprising a base material, the base material including a first surface portion having a first color coating with a first reflectance factor, and a second surface portion having a second color coating with a second reflectance factor;
- a first light emitting device mounted on the first surface portion of the substrate having the first color coating, the first light emitting device comprising one or more light emitting elements having a first color temperature, wherein the first color coating is effective to reflect or absorb light emitted from the light emitting elements of the first light emitting device in accordance with a desired color temperature for the illumination assembly;
- a second light emitting device mounted on the second surface portion of the substrate having the second color coating, the second light emitting device comprising one or more light emitting elements having a second color temperature, wherein the second color coating is effective to reflect or absorb light emitted from the light emitting elements of the second light emitting device in accordance with said desired color temperature;
- one or more of said light emitting devices further having the associated light emitting elements sealed by a resin containing a phosphor.

6. The illumination assembly of claim 5, further comprising a translucent resin applied on the light emitting devices and the substrate, the translucent resin having a refractive index and correspondingly effective to suppress variations in color temperature.

7. The illumination assembly of claim 6, further comprising a transparent case encompassing the light emitting devices, the substrate and the translucent resin applied on the light emitting devices and the substrate.

8. The illumination assembly of claim 7, wherein the inside of the case is completely filled with the translucent resin applied on the light emitting devices and the substrate.

* * * * *